United States Patent [19]
Kaiserman et al.

[11] Patent Number: 5,973,420
[45] Date of Patent: Oct. 26, 1999

[54] ELECTRICAL SYSTEM HAVING A CLEAR CONDUCTIVE COMPOSITION

[75] Inventors: Terrance Z. Kaiserman, Loxahatchee, Fla.; Adrian I. Rose, Gillette; Sel Avci, Clifton, both of N.J.; Andrew R. Ferber, New York, N.Y.

[73] Assignee: Colortronics Technologies L.L.C., East Newark, N.J.

[21] Appl. No.: 08/943,775

[22] Filed: Oct. 3, 1997

Related U.S. Application Data

[60] Provisional application No. 60/028,057, Oct. 3, 1996.

[51] Int. Cl.$^6$ ........................................ H01H 9/54
[52] U.S. Cl. .................. 307/139; 307/112; 204/192.29; 318/370; 428/46; 438/609
[58] Field of Search ...................... 307/112, 147, 307/139; 204/192.29; 313/370; 438/609; 428/46; 174/250

[56] References Cited

U.S. PATENT DOCUMENTS

| | | | |
|---|---|---|---|
| 3,855,583 | 12/1974 | Gudmundsen | 365/114 |
| 4,443,495 | 4/1984 | Morgan et al. | 427/96 |
| 4,825,048 | 4/1989 | Altmann et al. | 219/528 |
| 4,952,776 | 8/1990 | Huguet | 219/217 |
| 5,111,025 | 5/1992 | Barma et al. | 219/217 |
| 5,203,975 | 4/1993 | Richardson | 204/484 |
| 5,405,681 | 4/1995 | Nakayama et al. | 428/215 |
| 5,408,069 | 4/1995 | Mischel, Jr. | 219/219 |
| 5,440,425 | 8/1995 | Kadooka et al. | 359/512 |
| 5,448,037 | 9/1995 | Takase et al. | 219/547 |
| 5,455,749 | 10/1995 | Ferber | 362/103 |
| 5,517,003 | 5/1996 | Kadook et al. | 219/548 |
| 5,612,804 | 3/1997 | Hara | 349/149 |
| 5,626,948 | 5/1997 | Ferber et al. | 428/195 |
| 5,757,521 | 5/1998 | Walters et al. | 359/2 |

*Primary Examiner*—Albert W. Paladini
*Attorney, Agent, or Firm*—Lerner, David, Littenberg, Krumholz & Mentlik, LLP

[57] ABSTRACT

An electrical system, or a trigger circuit for use in connection with an electrical system, is disclosed. The electrical system includes a circuit element responsive to applied current, a power source for providing current to the circuit element, a substrate, and a substantially clear conductive composition arranged on or in associatin with the substrate for providing an electrical current path between the power source and the responsive circuit element.

35 Claims, 3 Drawing Sheets

ELECTRICAL SYSTEM HAVING A CLEAR CONDUCTIVE COMPOSITION

The present application claims benefit of U.S. Provisional Application No. 60/028,057, filed on Oct. 3, 1996.

FIELD OF THE INVENTION

The present invention relates to electrical systems including switch (trigger) circuits and conductive compositions. More particularly, the present invention relates to an electrical system, or a trigger circuit, for use as part of an electrical system, having a clear conductive composition.

BACKGROUND OF THE INVENTION

Conductive compositions have been developed for various purposes including facilitating electrostatic discharge and as a current transfer medium on printed circuit boards. Recently, conductive compositions have been used, instead of conventional conductive wires, as part of electrical systems. In particular, conductive compositions have been used as a means for conducting current from a power source to current operated modules on a variety of diverse objects such as printed circuit boards, wearing apparel and children's toys.

Examples of desirable electrical systems which use conductive compositions are disclosed in U.S. Pat. No. 5,455,749 which is incorporated by reference herein and which is commonly owned with the present application. The '749 patent discloses electrical systems which include a power supply, one or more current operated modules and conductive composition for connecting the power supply to the current operated module so that current generated by the power supply can be delivered to the current operating module. In one embodiment, the conductive composition may be colored where the coloring constitutes a substantially nonconductive portion of the conductive composition. In another embodiment, the conductive composition is arranged on an object and forms at least a portion of a design thereon. In another embodiment, the conductive composition includes features which render it sufficiently durable to withstand multiple washes without cracking, substantial resistance build-up or other failure. The aforementioned properties of the conductive compositions disclosed in the '749 patent are desirable in various applications.

Additional desirable electrical systems which use conductive compositions are disclosed in U.S. Pat. No. 5,626,948 which is also assigned to the owner of the present invention. The disclosure in the '948 patent is also incorporated by reference herein. The '948 patent particularly discloses a multilayer conductive composition which can be used as part of an electrical system. Since the multilayer conductive composition disclosed in the '948 patent is an improvement over prior art conductive compositions in that it can be used for "vertically conductive" applications (i.e., applications where it may be desirable to have a bottom layer of the conductive composition with a higher conductivity than a top layer thereof so that the top layer cannot conduct a substantial amount of current along the surface thereof). The invention disclosed in the '948 patent is also useful when it is necessary for the conductive composition to be a desired color.

It is also known in the art to provide substantially clear conductive compositions which have been useful for electrostatic discharge applications. For example, the substantially clear conductive composition may be spray coated around a computer workstation to avoid electrostatic build-up that may interfere with proper operation of an associated computer.

U.S. Pat. No. 5,203,975 to Richardson discloses a process for cathodic electrode deposition of a clear coating over a layer of conductive paint. However, the '975 patent does not teach that the clear coating should be electrically conductive. Thus, it clearly does not teach the use of a conductive composition as part of an electrical system.

Clear conductive compositions have also been used in the prior art as resistive circuit elements that form part of a windshield defrosting system. In this regard, clear conductive compositions have been applied directly to the surface of an automobile windshield. In such a system, when it is desired to defrost the windshield, a switch is closed inside the automobile which permits current to flow from a power source of the automobile through the clear conductive composition and then to ground. In such a circuit, the clear conductive composition function as a resistor which dissipates a variable amount of heat in direct proportion to the amount of current forced to flow through the resistive element (i.e., through the clear conductive composition traces on the windshield). The clear conductive composition traces in the automobile windshield defroster systems do not provide an electrical current path between the power source and a current responsive circuit element. Further, there is no trigger point which includes an open circuit area in the clear conductive composition whereby current is permitted to flow through the clear conductive composition to a responsive circuit element upon placement of an additional conductive object across the open circuit area.

Accordingly, the prior art has failed to provide an electrical system, or a trigger circuit for use as part of an electrical system, where a substantially clear conductive composition is arranged on a substrate for providing an electrical current path between a power source and at least one responsive circuit element. Moreover, the prior art has failed to provide such a system where the clear conductive composition is used as part of a switch (i.e., a trigger point).

SUMMARY AND OBJECTS OF THE INVENTION

In accordance with one aspect of the present invention, an electrical system is contemplated which includes at least one circuit element responsive to applied current. The electrical system may also include a power source for providing current to the at least one circuit element. A substrate is included as part of the electrical system and a substantially clear conductive composition is arranged on the substrate for providing an electrical current path between the power source and the at least one responsive circuit element.

The circuit element may comprise an active or passive circuit component. For example, the circuit elements may comprise a complicated integrated circuit having many current operated modules thereon, sound chip components, transistors, capacitors, inductors, resistors, diodes or the like.

Various substrates may be used in the electrical system of the present invention. For example, suitable substrates include fibrous materials such as paper products, various wallpapers, resins or inks, polymers, wood, fabrics and other electrically nonconductive materials. It should be appreciated that as used herein, the term substrate is intended to include the surface of any article or object which may be used for consumer or industrial purposes. Further, the substrate may include articles or objects which may or may not be conductive and which themselves have one or more layers of composition applied to the surface thereof arranged beneath the substantially clear conductive composition of the present invention. Further examples of objects which may serve as substrates include, without limitation, wearing apparel, toys, furniture, walls, dashboards of automobiles, etc.

Various independent and dependent power sources can also be used in accordance with the present invention. For example, the power source may comprise a source of AC or DC power. The power source may be a drainable supply, such as a battery, or it may be a constant generated power source. Further, the power source may comprise various combinations of electronic components and the like.

The substantially clear conductive composition of the present invention may comprise a resin, a vehicle in which the resin is dissolved or dispersed, and electrically conductive materials. The substantially clear electrically conductive composition may also comprise other components.

Although the ratio by weight of the components of the substantially clear electrically conductive composition of the present invention may vary, certain embodiments may include resin in an amount of between 5%–60% by weight thereof. The resin may comprise various known materials which have the desired binding characteristics to bind the additional ingredients of the electrically conductive composition. The resin may be selected from the group consisting of acrylics, urethanes, epoxies and oxidizing materials.

Many different types of resin and vehicles in which the resins may be dispersed or dissolved can be used in accordance with the present invention. Certain suitable resins and vehicles are described in the commonly assigned '948 patent, the disclosure of which is incorporated by reference herein.

The vehicle of the substantially clear electrically conductive composition of the present invention may be present in an amount of between about 5%–75% by weight thereof. The vehicle may comprise various solvents and other liquids in which the resin is dissolved or dispersed. Such solvents and other liquids may include, without limitation, aliphatic solvents, aromatic solvents, terpene solvents, alcohols, esters, chlorinated solvents, ether esters, ketones, glycols, glycolethers, platicizers, surfactants, polyols, defoamers, rosins, crosslinkers, silanes, dispersants and water. As used herein, the term dispersed is intended to cover embodiments wherein resin is carried by a liquid, rather than being truly dissolved therein. A liquid dispersion medium may be a medium in which the resin is dispersed, but in which other materials may be truly dissolved.

A substantially clear electrically conductive composition may also comprise one or more ingredients selected from the group consisting of flow agents, defoamers, wetting agents, cross-liking agents and curing agents. Examples of suitable clear conductive compositions are provided in Table I and formulation example nos. 1 and 2 below.

Electrically conductive materials may be present in the substantially clear conductive composition in an amount by weigh of between about 5%–80%. There is no limit on the specific types of electrically conductive materials which may be used in accordance with the present invention provided that such materials do not impart substantial opacity to the clear conductive composition. Antimony doped tin oxide or indium doped tin oxide have been found to be suitable conductive materials. Sodium magnesuim silicate powder may also be used.

Preferably, a trigger point (i.e., a switch) is incorporated into the present electrical system. The trigger point may include an open circuit area in the substantially clear conductive composition. To this end, the trigger point is functional upon placing a conductive object across the open circuit area thus creating a closed circuit condition whereupon current can flow to the responsive circuit element.

The electrical system may also comprise a second substrate and a second conductive composition arranged on the second substrate. In this embodiment, a closed circuit condition may be obtained upon placing the second conductive composition at the open circuit area of the clear conductive composition. In still another preferred embodiment, the second conductive composition may also comprise a clear conductive composition.

In another preferred embodiment, the electrical system of the present invention may comprise an opaque conductive composition arranged in physical contact with clear conductive composition whereby current can flow from the power source through both conductive compositions to activate the associated responsive circuit element.

In accordance with another aspect of the present invention, a trigger circuit is provided for use with an electrical system having a power supply. In accordance with this aspect of the present invention, the trigger circuit is simply a portion of the overall electrical system. According to this aspect of the present invention, the trigger circuit may comprise a circuit element responsive to applied current, a substrate, clear conductive composition arranged on the substrate for providing an electrical current path through which current supplied by an associated power source can flow. A trigger point is also provided including an open circuit area in the clear conductive composition. As discussed above, the trigger point may be rendered functional upon placing a conductive object across the open circuit area thus creating a close circuit condition whereupon current can flow to the responsive circuit element.

Another embodiment of the trigger circuit of the present invention may be modified from the trigger circuit discussed above in that the conductive composition arranged on the substrate need not be entirely made of clear conductive composition. In this embodiment, at least part of the conductive composition would be clear. If desired, the entire conductive composition of the trigger circuit may be clear. The trigger circuit may also comprise a second conductive object normally remote from the conductive composition where an associated trigger point is rendered functional upon placement of the conductive object across the open circuit area of the conductive composition. The open circuit area may be arranged at the clear portion of the conductive composition, or at an opaque portion of the conductive composition.

It is an object of the present invention to provide an electrical system, or a trigger circuit for use in connection with such electrical system, where at least a portion thereof comprises a substantially clear conductive composition arranged on or in association with a substrate for providing at least a portion of an electrical current path between an associated power source and a responsive circuit element.

It is a further object of the present invention to provide an electrical system, or a trigger circuit for use in connection with an electrical system, where it appears that a magical or mysterious response is obtained from an associated circuit element upon closing of the trigger circuit.

Further objects and advantages of the present invention will be more apparent when considered in combination with the following detailed description and drawings.

DETAILED DESCRIPTION OF THE PREFERRED EMBODIMENTS

The use of clear, conductive compositions of the type described herein as part of a trigger circuit for electrical systems have significant advantages with respect to activation of responsive circuit elements. Such circuit elements may be used to produce sound, light, heat, or various other visual, audio and functional effects.

In a preferred embodiment, the clear conductive compositions of the present invention are substantially colorless and thus may be referred to as water white. The clear conductive compositions of the present invention can be used in numerous consumer and industrial applications where it is desirable to use an "invisible" material as opposed to a material that has a certain opacity or color associated with it. For example, it has been established that the present clear conductive compositions can be effectively used in connection with electrical systems when coated on paper products, plastics, wood products, ceramics, marble and various other materials such as melamines, acrylics, apoxies, urethanes, alkyds and many other types of resin and other materials.

It is also possible to intermix or inbed the subject clear conductive compositions into products on which the compositions may or may not also be coated. For example, the clear conductive compositions can be incorporated into a pulp slurry used in the papermaking process to form conductive paper products. Similarly, the clear conductive compositions can be incorporated into a polymer mixture during a process for manufacturing various plastic materials in order to obtain a conductive plastic.

A novel and unobvious concept of the present invention also relates to the use of the subject clear conductive compositions in interactive trigger circuits. Various products can be coated with the subject clear conductive compositions for use in such interactive trigger circuits. Although there are too many uses to particularize herein, various examples will now be provided where a substantially clear conductive composition could be used as part of a trigger circuit. It should be appreciated that the clear conductive compositions of the present invention may be applied to a substrate surface by various known techniques such as knife coating, blade coating, air knife coating, reverse roll coating, gravure coating, transfer coating, vole coating, hot melt coating, spray coating, calendering, saturation, vacuum metalizing, laminating, dipping, extrusion, electrodeposition, powder coating techniques, screenprinting—flat and rotary, lithography or offset printing, letterpress, flexography, pad printing, transfer printing, brushing offset printing, decal application method, inkjet printing, thermography, and zerography. Other known and future methods of applying surface coatings besides those set forth above may also be used in order to apply the clear conductive compositions of the present invention to a substrate surface.

Use of the clear conductive compositions of the present invention may be particularly desirable when a "magical" or mysterious effect is desired as when a current responsive circuit element is activated without a visual indication that a switch has been closed to activate an associated circuit component.

The present invention is also directed toward a method of activating trigger circuits in electrical systems. Such a method may include the steps of providing at least one current responsive circuit element which is adapted to provide an output response to applied current, a power source for providing current to the at least one circuit element, a substrate, and a clear conductive composition arranged on or in association with the substrate for providing an electrical current path between the power source and the at least one current responsive circuit element. The method also includes the step of providing a second conductive object which may incorporate a conductive composition, a person's finger, or any other conductive material. A further step of the present method includes placing the second conductive object in contact with the substantially clear conductive composition on the substrate at a trigger point whereby electrical activation of the current responsive circuit element is achieved. Such triggering may be accomplished by bridging a normally open circuit area in the clear conductive composition with the second conductive object so that an electrical circuit is completed. In this environment, the combination between the normally open circuit in the clear conductive composition and the second conductive object acts as a switch.

Suitable examples of acceptable clear conductive compositions are set forth in Table I below:

TABLE 1

| Manufacturer | Dupont | Dupont | Dupont | Dupont | Dupont | Dupont | Dupont | CPS Chemical | Americhem | Dupont |
|---|---|---|---|---|---|---|---|---|---|---|
| Product | Zelec TY Antistat | Zelec NE Antistat | Zelec NK Antistat | Zelec UN Antistat | Avitex DN Softener | Avitex E Antistat | Zelec CD-100 | Agequat C1405 | System 3 Conductive Polymer | Avitex Softener |
| Composition | Alkyl Phosphate | Alkyl Phosphate | Alkyl Phosphate | Alkyl Phosphate Acidic | Quaternized Alkylol-Amine | Compounded Quaternary Ammonium Salt | Dispersion of ECP 3010-XC | Quaternary Ammonium Homopolymer | Solution of Conductive Polyaniline | Quaternary Alkylol-Ami |
| Ionic Type | Anionic | Anionic | Anionic | Anionic | Cationic | Cationic | N/A | Cationic | N/A | Cationic |
| Active Ingredients % | 50% | 100% | 100% | 100% | 35% | 21% | 40%± | 30–40% | 20–48% | 25% |

TABLE 1-continued

| | | | | | | | | | | |
|---|---|---|---|---|---|---|---|---|---|---|
| Density 25 C. lb./gal | 10.00 | 9.3 | 8.8 | 8.2 | 8.3 | 8.5 | 9.0 | 8.7–9.0 | 7.5–9.0 | 8.2 |
| pH 10% Aqueous Solution | 6.7–7.3 | 7.0–7.6 | 7.0–7.6 | 1.0–3.0 | 7.0–9.0 | 6.0–8.0 | N/A | 4.0–5.0 | N/A | 6.5–7.5 |

The resistivity levels of each of the above listed products range from 500 ohms to above 20 megaohms.

A more specific formulation of two examples of clear conductive compositions which have been found to be effective for use in connection with the present trigger circuit now follows:

FORMULATION NO. 1

| INGREDIENTS | PERCENTAGE BY WEIGHT |
|---|---|
| $H_2O$ | 60% |
| Laponite RDS, Sodium Magnesium Silicate Powder (available from Southern Clay Products) | 14% |
| A-5090 - a water based acrylic polymer (available from Zeneca) | 26% |

This formulation of a clear conductive polymer has been found to be effective as a sprayable or dippable composition, which is an acrylic dispersion. In obtaining this clear conductive composition, 14% by weight of sodium magnesium silicate powder was mixed with 60% by weight of water. These materials were mixed in a high speed blender until all of the dry sodium silicate powder was completely dissolved. The clear composition was then blended with 26% by weight of a water-based acrylic polymer (A-5090). The overall composition can be applied to various nonconductive substrates for use as part of a trigger circuit.

Although the film thickness may vary, the clear conductive composition was effective at transmitting current at approximately 1 ml when applied to the surface of a nonconductive substrate. After being sprayed, or otherwise applied to a substrate surface, it may be desirable to take steps to expedite drying of the composition. When dry, the composition is entirely clear. The surface resistivity at 1 ml thickness was found to be about 5 megaohms square for the foregoing formulation.

FORMULATION NO. 2

| INGREDIENTS | PERCENTAGE BY WEIGHT |
|---|---|
| ZELEC TY (commercially available from DuPont) | 75% |
| A-5090 - a water based acrylic polymer (commercially available from Zeneca) | 25% |

Seventy-five percent by weight of ZELEC TY, a commercially available product from DuPont was blended with 25% by weight of a water based polymer. The water based polymer can be acrylic or polyurethane based. The mixture was then mixed in a highspeed blender until a uniform compound was obtained. The resulting material was then applied onto the surface of a paper substrate to form a 1 ml thick film. The clear conductive composition film was then cured with an air dryer. The surface resistivity was measured and found to be substantially conductive.

Figure 1:
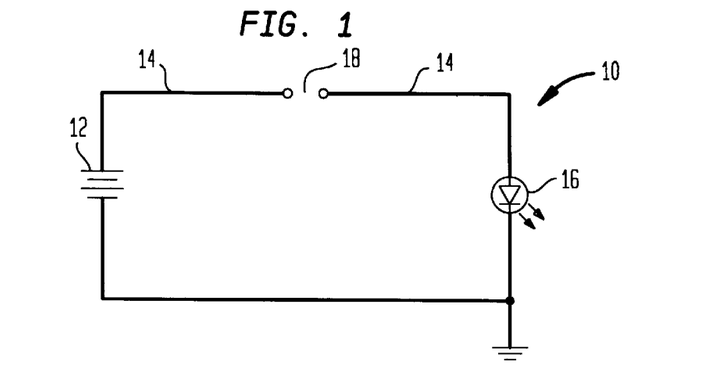
FIG. 1 is a simplified schematic diagram of an electrical system of the present invention.

An electrical system 10 is schematically illustrated in FIG. 1. The electrical system 10 includes a power supply 12, clear conductive composition leads 14, a light emitting diode (LED) 16, and an open circuit area 18 between a high side of the lead 14 which is connected to the power supply 12 and a low side of the lead 14 which is connected to ground. For the purpose of this simplified schematic, the substrate on which the electrical system 10 is mounted is not shown. In operating this simplified circuit, a user would simply place a conductive object across the open circuit area 14 to connect the high and low leads of clear conductive composition 14 to each other. This will permit current to flow to activate LED 16 (e.g., a responsive circuit element) so that a visual lighted effect can be achieved. The "trigger point" includes the combination between the open circuit space 18 and the corresponding high and low sides of the clear conductive composition leads 14.

Figure 2:
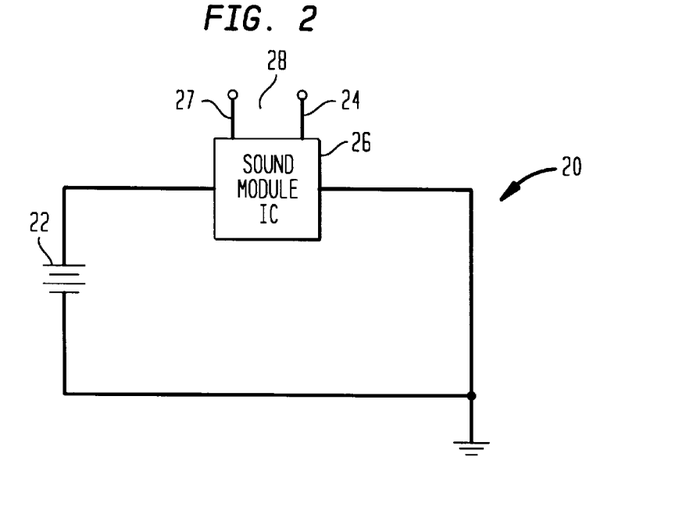
FIG. 2 is another simplified schematic of the present electrical system.

FIG. 2 illustrates a further simplified electrical schematic of the present invention. In this scenario, a sound module 26 is electrically connected as part of electrical system 20. A power supply 22 is connected to the sound module 26 and to one side (i.e., the high side) of a clear conductive composition lead 24. The other side (i.e., the low side) of the clear conductive composition 24 is connected to ground. An open circuit area 28 exists between the high side and the low side of the clear conductive composition leads 24. If a conductive object is placed between the high and low sides of the clear conductive composition leads 24, a closed circuit condition would occur which would permit current to flow from the power source 22 through the sound module 26 so that a desired sound would be produced. Many types of conductive objects would be sufficient to close the circuit between the high and low sides of the trigger circuit. For example, depending upon the current requirements of the sound module 26, a person's finger may have sufficient conductivity to complete the circuit.

It should be appreciated that the electrical characteristics of the simplified circuits shown in the drawings are not new. It is the arrangement of the clear conductive compositions of the present invention as part of such trigger circuits that provide the novelty and unobvious nature of the present invention.

Figure 3:
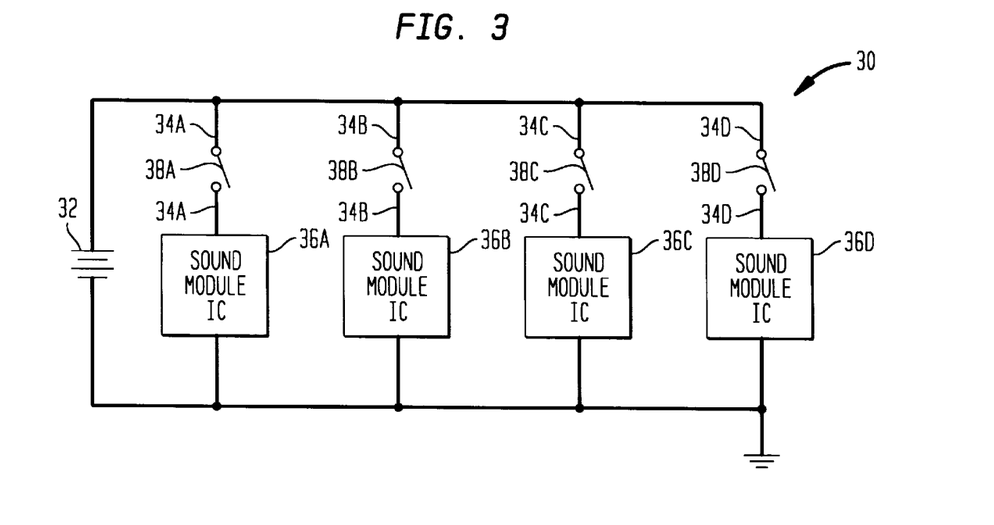
FIG. 3 is another embodiment of a simplified schematic of an electrical system used to produce multiple circuit element responses within an electrical system of the present invention.

FIG. 3 illustrates a similar electrical system to that of FIGS. 1 and 2. The difference is that FIG. 3 includes four separate responsive circuit elements 36A–36D, which may produce similar or different characteristics. For example, 36A–36D may comprise four separate sound chips. Thus, the electrical system 30 would be capable of producing four separate sounds depending upon which part of the circuit is activated. If a conductive object is placed across any of the respective open circuit areas 38A–38D, current would flow between the high side of the conductive compositions 34A–34D which is connected to the power source 32, and the low side thereof, which is connected through the corresponding circuit elements 36A–36D to ground.

Since the clear conductive composition leads are not visible, a user would need to know a reference point to determine exactly where the trigger point is in electrical system in order to activate the associated circuit. Depending upon the application, such an arrangement may be particularly practical, or may be fun. Examples of applications include the following:

EXAMPLE NO. 1—RESTAURANT CONCEPT

In order to make paper and plastics products interactive, they must first be made conductive. Some items found in a fast food restaurant that may be coated with a clear conductive compound would be napkins, straws, placemats, food wrapping paper, french fry holders, drinking cups, plastic eating utensils, drink lids, food trays, game cards, etc. (see for example FIG. 5 and the discussion regarding same below). Once these items absorb moisture from the air and retain that moisture on the surface making the coating hygroscopic, they will act as conductors or trigger devices. In essence the moisture content of the substrate is changed. The compounds must be food safe and can either be on a top coat after the particular substrate is printed and cut in its final form or can be intermixed into the paper or plastic making process from the beginning stages as discussed above. This would be a simple formulation change and keep the converting costs the same as they normally would be. If the clear conductive compositions are actually imbedded into paper material due to intermixing during the manufacturing process, they may not need a resin.

When these conductive paper or plastic materials are incorporated into an interactive point of purchase (POP) display, they can be used as part of a trigger circuit which will create a closed circuit condition when contacted with another conductive material at a trigger point. This will cause the interactive display to commence its preprogrammed activity. This could be to turn on a transistor that would activate a sound chip and/or lights or could start a motor. This interactive POP could announce a game prize, make random sounds applicable to a particular promotion, turn on lights and a spinning wheel or any iterations that one can think. All possibilities of using combinations that would commence when turning on an electrical circuit could be accomplished, this circuit can be powered using AC or DC power sources, whichever is needed for the proper design and performance of the Interactive POP.

EXAMPLE NO. 2—TOY CONCEPT

A piece of cloth used as doll clothing or a doll hand could have a transparent coating on it. The coating would not only be hygroscopic but would also contain conductive compounds that are chosen to be water white (clear) or almost water white. These would be more permanent coatings that would have more stringent ultimate properties in order to pass certain abrasion and wear requirements dictated by the particular substrate usage mandated by a customer. These coatings would act as triggers to turn on an electrical circuit. The advantage of using a clear coating is obvious. There is no color matching necessary to accomplish making something conductive. It can be applied with greater ease. A colored coating that is not evenly sprayed shows surface variations which equate to visible color shifts. Although clear conductive compositions should also be applied as evenly as possible, there are no visible color shirt due to uneven coating application.

A doll could touch another doll and they would talk to each other because they are holding hands and it would trigger a gossip conversation. A plastic cat could touch a doll and trigger a purring sound—a meow or a comment from the pet owning doll. These examples are limited by your imaginatiion.

EXAMPLE NO. 3—HOME FURNISHING CONCEPT

There is a clear spray that can be sprayed on a wall to make it conductive in order to attach it to a light switch touch control circuit (see for example, FIG. 4 and the description of same below). This would allow an invisible conductive composition path to be applied from the wall next to their easy chair to the light on/off switch (especially designed for touch activation. Additional coating methods may be employed to apply conductive compositions of the present invention to a wall surface. Instead of requiring a person to walk over to a wall or lamp switch to turn off lights, he could touch the wall at a trigger point between "invisible" conductive composition leads and turn on/off or even dim the lights. Various versions of conductive compositions could be manufactured that have different gloss levels in order to match the gloss level of many paints and other wallcoverings.

EXAMPLE NO. 4—SAFETY CONCEPT

Existing security screens must be sent to an outside contractor when it is necesssary to have them re-worked with conductive wires. The procedure is costly, time consuming and results in visible wires. One application of the present invention contemplates coating screens with a clear conductive composition. The clear conductive compositions would be attached to a circuit to allow for the same level of security that exists in the present method. Existing screens found at the client's home could be used with an installer spraying or otherwise coating those screens on site. No delay and immediate security for the customer are obtained while the installer benefits from increased profits.

EXAMPLE NO. 5—TALKING BOOK CONCEPT

Electric books, commonly referred to as talking books, could have overcoats of a clear conductive compound that would not interfere with the four color process printing. Prints could be made with a printing plate or spot coated using clear conductive compounds and these selected locations could act as trigger points to actuate a circuit and appear invisible to the reader. The actuation could be for sound, lights or motors or a combination of same. These locations could be actuated by touching, absorbing moisture from the air announcing messages of humidity. They could be actuated by heat and given messages that it is hot today and many more examples. Again limited by imagination.

Figure 4:
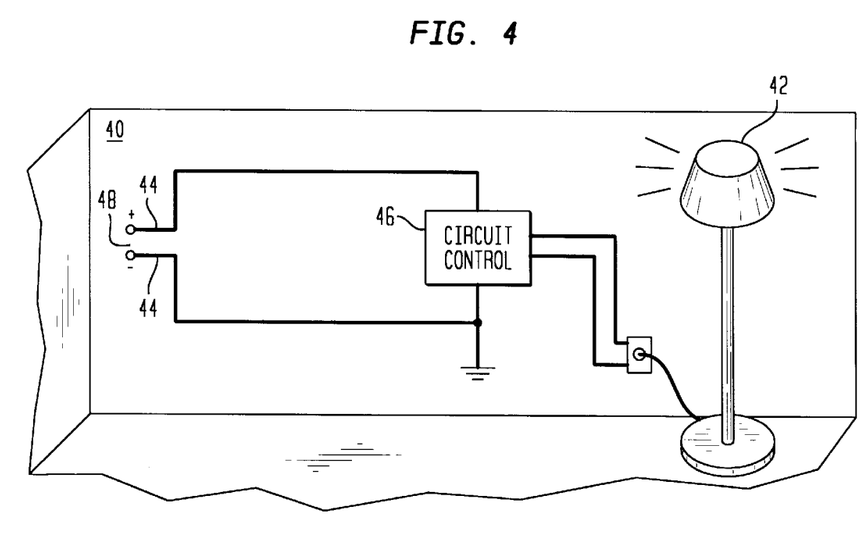
FIG. 4 is a schematic illustration of the present electrical system used as a light switch.

FIG. 4 illustrates an application of clear conductive compositions in accordance with the home furnishing example discussed above. In this regard, a portion of a room is displayed which includes a wall 40. A lighting fixture 42, such as a lamp, is plugged into an ordinary 120 volt AC power source.

Operation of the lamp 42 may be controlled by a standard wall switch, or by touch activation of the clear conductive composition leads 44 at trigger point 48. The high and low conductive composition leads 44 would need to be touched by a conductive object such as a person's finger, across the open circuit area at trigger point 48 so that current is permitted to flow from the AC power source through the control circuit 46 and the clear conductive composition 44 and the resistive light bulb and then to ground.

The arrangement shown in FIG. 4 may be practical as it provides an additional location at which lamp 42 can be turned on and off. At the same time, since the conductive composition is entirely clear, it does not disturb the desired aesthetic appearance of the room. Further, the present invention is fun in that a person can simply touch a designated spot on the wall in order to achieve the magical effect of a light bulb turning on or off. The clear conductive composition 44 may be applied to the wall 40 by various methods including brush on, spray coat, etc.

Figure 5:
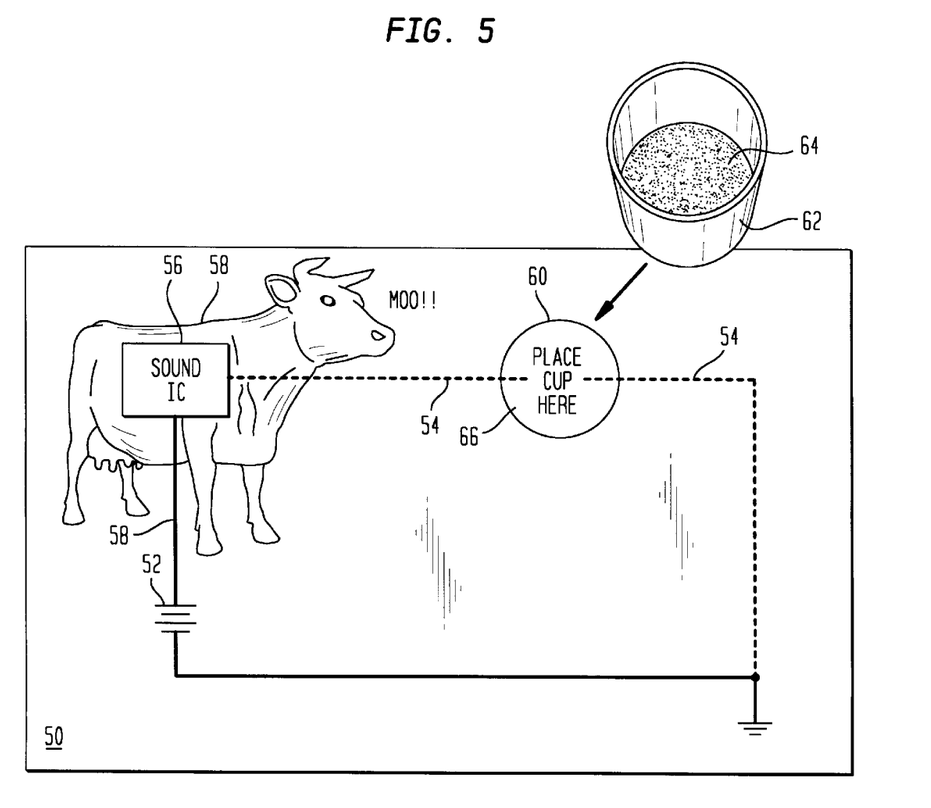
FIG. 5 is a schematic illustration of the present electrical system used as an interactive placemat assembly.

FIG. 5 illustrates yet another application of the present invention in accordance with the interactive restaurant concept discussed above. In particular, a paper placemat 50 is shown with a combination of opaque conductive composition 58 in the form of a cow design and a trace pattern, and clear conductive composition 54 thereon. It is desirable of the electrical characteristics of the opaque conductive composition 58 and the clear conductive composition 54 be substantially the same in order to obtain optimum operation of the associated circuit.

The placemat assembly 50 shown in FIG. 5 is interactive when combined with cup 62 having conductive composition 64 coated at the bottom thereof. The conductive composition 64 may be clear or opaque. Reference indicia is provided on the placemat 50 to instruct a person where to place the cup 62 at reference location 60 between high and low trigger leads of the clear conductive composition 54. The printed reference location 60 should not be made of conductive composition as it is desirable to maintain an open circuit condition between the high and low leads of the conductive affect composition 54 at trigger point 66 when the interactive cup 62 is not placed thereon.

Placemat 50 initially appears as a conventional placemat with a design of a cow (arbitrarily selected) thereon. The cow is printed of opaque or colored conductive composition 58 and is connected for direct electrical communication with the high side of the power supply 52. The sound circuit 56 is electrically connected to the opaque conductive composition 58 at the high side of the clear conductive composition 54. For purposes of distinguishing between the clear conductive composition 54 and the conductive composition 58, the clear conductive composition has been illustrated in FIG. 5 with dotted lines. However, it should be undersood that the clear composition is continuous on the surface of placemat 50.

When a cup 62 is placed at reference location 60 the conductive composition 64 coated at the bottom of the cup 62 creates a closed circuit condition at trigger point 66 between the high and low leads of the clear conductive composition 54. Current is then permitted to flow from the power source 52 through the conductive compositions 58 and 54 and the sound chip 56 to ground. The sound chip 56 is programmed to create animal sounds such as "moo" which appear to be coming from the cow design on the placemat. This sound effect appears to be magical as the clear conductive composition 54 cannot be seen and there appears to be no wires or other conductive flow path or switches on the menu 50.

Figure 6:
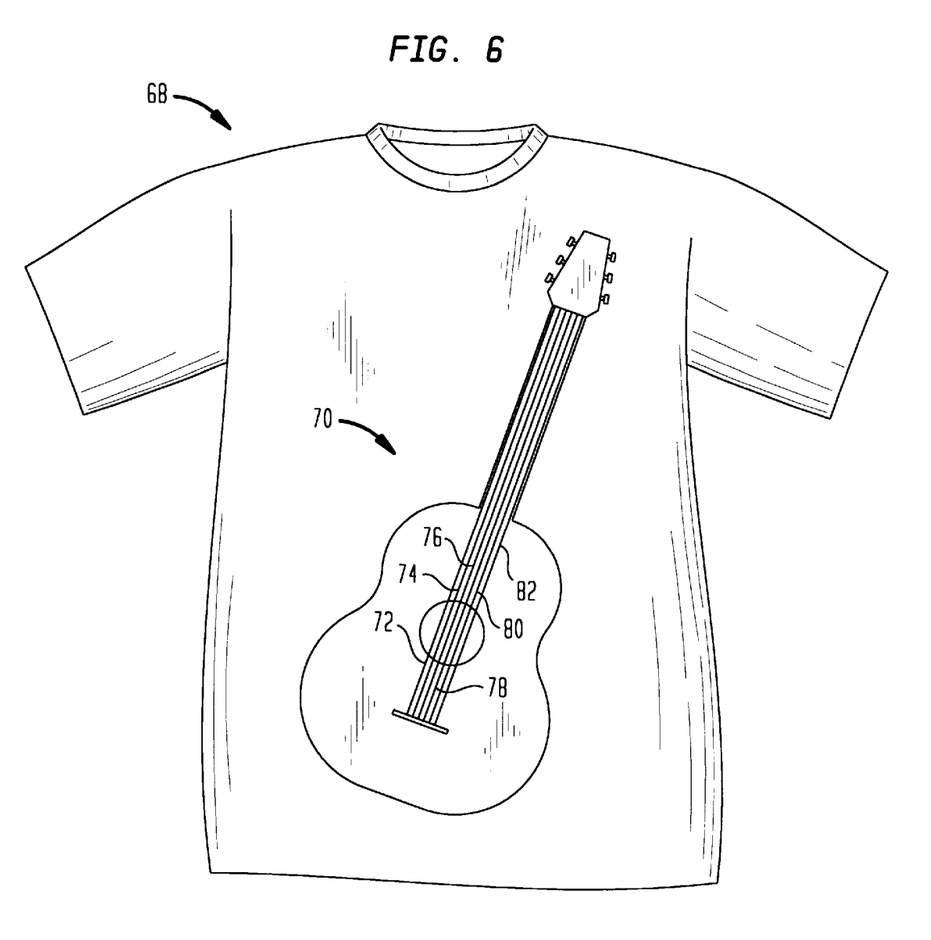
FIG. 6 is a diagrammatic sketch of an article of clothing including the electrical system of the present invention arranged to form a design.

FIG. 6 illustrates yet another embodiment of the electrical system of the present invention where a substrate comprises a T-shirt 68. A trigger circuit 70 is shown in the form of a guitar printed on the T-shirt 68 with opaque colored conductive composition in accordance with the disclosure in the commonly owned '749 patent. Trigger circuit 70 includes a power source (not shown) which may be sewn into a pocket of the T-shirt 68. The guitar design includes six strings 72–82, which are also printed out of colored conductive composition.

In order to activate the trigger circuit 70, it is necessary to touch one or more of the conductive composition strings 72–82 with another conductive object. Such a conductive object may comprise a toy pick (not shown), which itself is nonconductive but is rendered conductive when coated with a clear conductive composition in accordance with the present invention. As the clear conductive composition on the pick is placed in contact with one or more of the colored conductive composition strings 72–82, a sound circuit (also not shown) is activated which may be programmed to produce sounds associated with corresponding guitar strings. It should also be appreciated that the electrical system shown in FIG. 6 including the guitar design may use the "vertical conductivity" concept disclosed in the commonly owned '948 patent.

While the foregoing description and figures are directed toward the preferred embodiments of the present invention, it should be appreciated that numerous modifications can be made to various features of the present invention. Indeed, such modifications are encouraged to be made to the present electrical system, and trigger circuit thereof, without departing from the spirit and scope of the invention. Thus, the foregoing description of the preferred embodiments should be taken by way of illustration rather than by way of limitation as the present invention is defined by the claims set forth below.

We claim:

1. An electrical system comprising:
   at least one circuit element responsive to applied current; a power source for providing current to said at least one circuit element; a substrate; substantially clear conductive composition arranged on said substrate for providing an electrical current path between said power source and said at least one responsive circuit element; and a trigger point including an open circuit area in said clear conductive composition, said trigger point being functional upon placing a conductive object across said open circuit area thus creating a closed circuit condition whereupon current can flow to said responsive circuit element.

2. The electrical system of claim 1 wherein said at least one circuit element comprises an active circuit component.

3. The electrical system of claim 1 wherein said at least one circuit element comprises a passive circuit component.

4. The electrical system of claim 1 wherein said substrate comprises wallpaper.

5. The electrical system of claim 1 wherein said substrate comprises a fibrous material.

6. The electrical system of claim 1 wherein said substrate comprises a polymer.

7. The electrical system of claim 1 wherein said substrate comprises wood.

8. The electrical system of claim 1 wherein said substrate comprises a fabric.

9. The electrical system of claim 1 wherein said substrate is selected from the group consisting of cured resins, paints or inks.

10. The electrical system of claim 1 wherein said substrate is substantially nonconductive.

11. The electrical system of claim 1 wherein said clear conductive composition comprises a resin, a vehicle in which said resin is dispersed or dissolved, and electrically conductive material.

12. The electrical system of claim 11 wherein said clear conductive composition comprises a vehicle and electrically conductive material.

13. The electrical system of claim 1 further comprising an opaque conductive composition arranged in physical contact with said clear conductive composition whereby current can flow from said power source through both of said clear conductive composition and said opaque conductive composition to activate said responsive circuit element.

14. The electrical system of claim 1 further comprising a second substrate and a second conductive composition arranged on said second substrate, said closed circuit condition being obtained upon placement of said second conductive composition at said open circuit area of said clear conductive composition.

15. The electrical system of claim 14 wherein said second conductive composition comprises a clear conductive composition.

16. A trigger circuit for use with an electrical system having a power supply, said trigger circuit comprising:
at least one circuit element responsive to applied current; a substrate; conductive composition arranged on said substrate for providing an electrical current path through which current supplied by the power supply can flow, at least part of said conductive composition being clear composition; a trigger point including an open circuit area in said conductive composition; and a second conductive object normally remote from said conductive composition, said trigger point being functional upon placement of said conductive object across said open circuit area thus creating a closed circuit condition whereupon current can flow to said responsive circuit element.

17. The trigger circuit of claim 16 wherein said open circuit area is arranged at said clear portion of said conductive composition.

18. The trigger circuit of claim 16 wherein said conductive object comprises clear conductive composition arranged on a substrate.

19. The electrical system of claim 16 wherein said at least one circuit element comprises an active circuit component.

20. The electrical system of claim 16 wherein said at least one circuit element comprises a passive circuit component.

21. The electrical system of claim 16 wherein said substrate comprises wallpaper.

22. The electrical system of claim 16 wherein said substrate comprises a fibrous material.

23. The electrical system of claim 16 wherein said substrate comprises a polymer.

24. The electrical system of claim 16 wherein said substrate comprises wood.

25. The electrical system of claim 16 wherein said substrate comprises a fabric.

26. The electrical system of claim 16 wherein said substrate is selected from the group consisting of cured resins, paints or inks.

27. The electrical system of claim 16 wherein said substrate is substantially nonconductive.

28. The trigger circuit of claim 17 wherein a portion of said conductive composition comprises opaque conductive composition arranged in physical contact with said clear conductive composition whereby current can flow from said power supply through both of said clear conductive composition and said opaque conductive composition to activate said responsive circuit element.

29. The electrical system of claim 16 wherein said clear conductive composition comprises a resin, a vehicle in which said resin is dispersed or dissolved, and electrically conductive material.

30. The electrical system of claim 29 wherein said clear conductive composition comprises a vehicle and electrically conductive material.

31. A trigger circuit for use with an electrical system having a power supply, said trigger circuit comprising:
at least one circuit element responsive to applied current; a substrate; clear conductive composition arranged on said substrate for providing an electrical current path through which current supplied by the power supply can flow; and a trigger point including an open circuit area in said clear conductive composition, said trigger point being functional upon placing a conductive object across said open circuit area thus creating a closed circuit condition whereupon current can flow to said responsive circuit element.

32. The electrical system of claim 31 wherein said at least one circuit element comprises an active circuit component.

33. The electrical system of claim 31 wherein said at least one circuit element comprises a passive circuit component.

34. The electrical system of claim 31 wherein said substrate is substantially nonconductive.

35. The electrical system of claim 31 wherein said clear conductive composition comprises a resin, a vehicle in which said resin is dispersed or dissolved, and electrically conductive material.

* * * * *

UNITED STATES PATENT AND TRADEMARK OFFICE
CERTIFICATE OF CORRECTION

PATENT NO. : 5,973,420
DATED : October 26, 1999
INVENTOR(S) : Kaiserman et al.

It is certified that error appears in the above-identified patent and that said Letters Patent is hereby corrected as shown below:

Column 12, line 63, "claim 11" should read --claim 1--.
Column 14, line 8, "claim 17" should read -- claim 16--.

Signed and Sealed this

Eighteenth Day of July, 2000

Attest:

Q. TODD DICKINSON

*Attesting Officer*                    *Director of Patents and Trademarks*